United States Patent
Suzuki et al.

(10) Patent No.: US 6,744,249 B2
(45) Date of Patent: Jun. 1, 2004

(54) METHOD AND INSTRUMENT FOR MEASURING A MAGNETIC FIELD, A METHOD FOR MEASURING A CURRENT WAVEFORM, AND METHOD FOR MEASURING AN ELECTRIC FIELD

(75) Inventors: Hiroshi Suzuki, Kodaira (JP); Tomokazu Shimakura, Kokubunji (JP); Kimio Nakamura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 52 days.

(21) Appl. No.: 10/143,895

(22) Filed: May 14, 2002

(65) Prior Publication Data

US 2003/0042899 A1 Mar. 6, 2003

(30) Foreign Application Priority Data

Aug. 29, 2001 (JP) ........................ 2001-259155

(51) Int. Cl.$^7$ .................. G01R 33/02; G01R 29/14
(52) U.S. Cl. .................. 324/250; 324/227; 324/751
(58) Field of Search ........................ 324/227

(56) References Cited

U.S. PATENT DOCUMENTS

| | | | | |
|---|---|---|---|---|
| 3,673,494 A | * | 6/1972 | Vitek et al. | 324/250 |
| 4,803,430 A | * | 2/1989 | Shinada et al. | 324/250 |
| 5,075,623 A | * | 12/1991 | Matsuda et al. | 324/250 |
| 5,111,141 A | * | 5/1992 | Fukuhara et al. | 324/250 |
| 5,153,434 A | * | 10/1992 | Yajima et al. | 250/311 |
| 5,387,793 A | * | 2/1995 | Sato et al. | 250/310 |
| 5,572,122 A | * | 11/1996 | Yajima et al. | 324/250 |
| 5,666,053 A | * | 9/1997 | Suzuki et al. | 324/250 |

FOREIGN PATENT DOCUMENTS

JP  4-372887  6/1991
JP  07072227 A  *  3/1995  ......... G01R/33/028

OTHER PUBLICATIONS

Nomizu et al., "Reconstruction of Magnetic Fields by Reflection Electron beam Tomography," IEEE Transactions on Magnetics, vol. 32, No. 5, Sep. 1996, pp. 4926–4928.*
Nakamura et al., "Transient Time Measurement of Head Magnetic Field by Using Electron Beam Tomography," IEEE Transactions on Magnetics, vol. 35, No. 5, Sep. 1999, pp. 2529–2531.*
Suzuki et al., "Magnetic Head Field Over the Air–Bearing Surface as Visualized by the Projection of a Patterned Electron Beam," IEEE Transactions on Magnetics, vol. 36, No. 5 Sep. 2000, pp. 3614–3617.*
Hiroyuki Shinada, Satoru Fukuhara, Shigematsu Seitou, Hideo Todokoro, Shigekazu Otomo, Hisashi Takano and Kazuo Shiiki, "Dynamic Micromagnetic Field Measurement by Stroboscopic Electron Beam Tomography", 1992 IEEE, Transactions on Magnetics, vol. 28, No. 2, Mar. 1992, pp. 1017–1023.

* cited by examiner

Primary Examiner—Jay Patidar
Assistant Examiner—Darrell Kinder
(74) Attorney, Agent, or Firm—Reed Smith LLP; Stanley P. Fisher, Esq.; Juan Carlos A. Marquez, Esq.

(57) ABSTRACT

A method and instrument for measuring, with a high spatial resolution, a magnetic or electric field that varies repeatedly at high speed. An electron beam is deflected by passage through a magnetic or electric field to be measured and is allowed to pass through a deflection electrode to thereby be deflected in a direction perpendicular to the magnetic or electric field to be measured. A track of the deflected electron beam is detected by a two-dimensional sensor, and a waveform or pattern is displayed wherein a time base and an axis of the magnetic field to be measured are orthogonal to each other.

20 Claims, 11 Drawing Sheets

METHOD AND INSTRUMENT FOR MEASURING A MAGNETIC FIELD, A METHOD FOR MEASURING A CURRENT WAVEFORM, AND METHOD FOR MEASURING AN ELECTRIC FIELD

CLAIM OF PRIORITY

This application claims priority to Japanese Patent Application No. 2001-259155 filed on Aug. 29, 2001.

BACKGROUND OF THE INVENTION

1. Field of the Invention

The present invention relates to methods and instruments for measuring the magnetic and electric characteristics of devices that vary with time such as measuring a magnetic field and magnetizing current (excitation current) in a magnetic write head operating at a high frequency.

2. Description of the Background

An analytical method using electron beam concerning material properties is conventionally used for the analysis and measurement of various characteristics of magnetic materials because it has a high spatial resolution (i.e., detect small displacements) and an electron beam is sensitive to magnetism. However, the speed of operation of magnetic devices, such as magnetic heads, has been increasing recently. To analyze the properties of these high speed devices, not only a high spatial resolution, but also the ability to measure magnetic characteristics that vary at high speed (i.e., "high time resolution") is required.

A method for measuring timewise varying magnetic characteristics using an electron beam is known and described in, for example, *IEEE Transaction of Magnetics*, Vol. 28, No. 2, March 1992. According to this conventional method, a stroboscopic electron beam is generated and is passed through a magnetic field synchronized with the period of the alternating current of a write head. Only information at a specific phase in a magnetic field distribution, which varies periodically, is extracted. The phase can be arbitrarily determined, and the magnetic field distribution can be measured at any time in the period of the alternating current.

To monitor a magnetizing current (excitation current) of a magnetic head operating at a high frequency, there is widely adopted a method of measuring the waveform of an electric current flowing through a wire using a current probe. According to this method, a generated electromotive force (emf) is detected by a current transformer installed in the vicinity of the wire, with a terminated end connected to, for example, an oscilloscope for display as a waveform.

Another method used to measure a timewise varying magnetizing current in a magnetic head is described in Japanese Published Unexamined Patent Application No. 4-372887. According to this method, as shown in FIG. 10, a resistor 4 is inserted in series with a magnetic head 28, and a voltage developed across the resistor is fed to a deflection electrode 5. A stroboscopic electron beam pulse 11 having the same timing as that for magnetic field measurement is passed through the deflection electrode 5 and a displacement of the beam deflection is detected by a position sensor 15 and is converted to a current value. That is, an electric current is measured in terms of an electric field. In this method, which does not use a current probe, the electron beam 10 is made into a stroboscopic electron beam 11, and the stroboscopic electron beam is irradiated in conformity with the period of the alternating current of the magnetic head 28 which varies repeatedly. Only information at a specific phase is extracted, and sampling is made while gradually changing the timing thereof. Using this method, it has been possible to measure the waveform of a magnetizing current over a specific time range.

In the above conventional method using an electron beam, the electron beam 10 must be made into a stroboscopic electron beam 11 by blanking with use of a high-speed deflector 24 and an aperture 25, and the pulse width of the stroboscopic electron beam 11 is determined in terms of a time resolution. For example, given that one operation period is T and further given that a time-resolution necessary for the measurement thereof is one-twentieth of one period, a pulse width of no more than T/20 or less is required.

A high-speed deflection electrode 24 and an aperture plate 25 having a small aperture are in many cases employed for generating an electron beam pulse. Herein, it is assumed that the electron beam converged on the aperture is deflected at ±1V. When the ratio between the displacement of the beam deflection and the diameter of the aperture is 5:1, and when a pulse width of 1 ns is needed, a "reversal" time (rise time or fall time) of the voltage signal of approximately 5 ns is necessary. If a pulse width of 0.1 ns is needed, a reversal time of 0.5 ns is necessary.

With the recent increase in the driving frequency of magnetic devices such as magnetic heads, an increased measurement time resolution has come to be demanded, and the pulse width of the required electron beam is being continually reduced. However, when the pulse width is decreased using the above method, if a signal with a short reversal time is input to the deflection electrode, a reflection or overshoot caused by the wire or load may occur, and the signal may therefore become a nonlinear input signal. As a result, it is not possible to deflect the electron beam with an accurate reversal time. Thus, this conventional method is limited in that an electron beam pulse cannot be accurately generated with a sufficiently short pulse width.

SUMMARY OF THE INVENTION

The present invention preferably provides instruments and methods to effect the measurement of a high-frequency magnetic field with a high time-resolution without using a quickly reversing voltage signal, that is, without converting the electron beam into a stroboscopic pulse.

Conventional methods have been limited in that if a current probe is used to monitor a high-frequency current used to operate a magnetic head, the load thereof exerts an influence on the current circuit itself, causing the detected waveform to be distorted. This limitation makes it impossible to accurately measure a current waveform in a magnetized state. The present invention, therefore, also preferably provides devices and methods to realize a highly sensitive and accurate current monitor without using a current transformer and, hence, without burdening a current circuit.

According to one aspect of the present invention, to address the above-mentioned limitations of the conventional methods, there is preferably provided an instrument for measuring a magnetic field comprising: a source of a charged particle beam; means for converging the charged particle beam; means for generating a magnetic field to be measured; means for directing the charged particle beam through a desired position in the magnetic field to be measured; means for deflecting the charged particle beam in a direction different from a beam deflection direction caused by the magnetic field to be measured; means for providing a control signal to the means for deflecting the charged particle beam in the different direction; means for enlarging the displacement of deflection of the deflected charged particle beam; a two-dimensional sensor for detecting the enlarged displacement of beam deflection; and a display for displaying the track of the charged particle beam detected by the sensor. This embodiment may also be employed with just the charged particle beam, the magnetic head, the deflection means for deflecting the beam in a different angle from the magnetic head, and same type of sensor and/or display.

According to another aspect of the present invention, the above instrument may further comprise means for switching ("on" and "off") the irradiation of the charged particle beam into the magnetic field to be measured at a position between the source of the charged particle beam and the means for generating the magnetic field to be measured and means that control the irradiation of the charged particle beam into the magnetic field, and non-irradiation thereof, by providing a signal to the means for switching the irradiation.

According to a further aspect of the present invention there is provided a method for measuring a magnetic field by utilizing an interaction with a charged particle beam comprising the steps of: generating a charged particle beam from a source; converging the charged particle beam; generating a magnetic field to be measured using of a signal; allowing the converged charged particle beam to pass through a predetermined position in the magnetic field; deflecting the charged particle beam in a direction different from a direction of deflection of the charged particle beam caused by the magnetic field while controlling the deflection with the signal fed; causing the magnetic field to be measured and the signal for deflecting the charged particle beam to change with a predetermined period; enlarging the displacement of deflection of the deflected charged particle beam; detecting the enlarged displacement of beam deflection with use of a two-dimensional sensor; and displaying a detected track of the charged particle beam. The steps in the method may also be compacted as was described above with respect to the instrument.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

Figure 1:
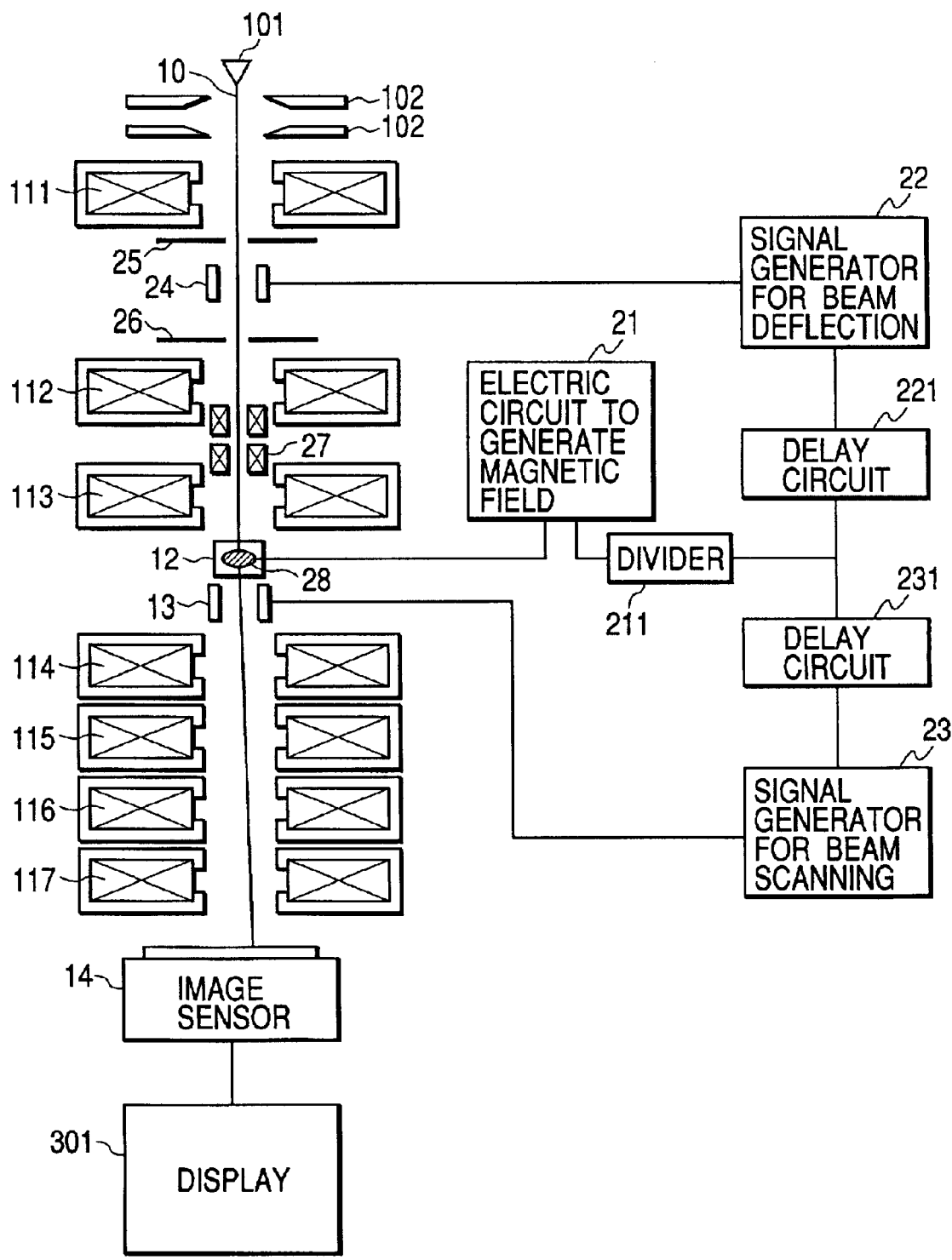
FIG. 1 illustrates an instrument according to the present invention.

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

In a first exemplary mode of the invention, a particle beam source, such as an electron beam source, an electron beam converging means, a magnetic or electric field to be measured, means for deflecting the electron beam, means for enlarging the displacement of deflection of the electron beam, and a two-dimensional sensor are arranged in order. The electron beam is converged near the magnetic field to be measured and is conformed to a desired position which the magnetic field to be measured by scanning and deflection means. A means which generates the magnetic field is connected to an electric circuit or similar device for changing the magnetic field with time (periodically).

The periodic signal which controls the change in the magnetic field is used as a trigger signal while leaving the period thereof as it is or after dividing the frequency. The trigger signal is then fed to a waveform generator which generates, for example, a sawtooth or triangular waveform. This waveform is input to the deflecting means, and the electron beam is deflected at a constant speed by utilizing a rectilinear portion of the waveform. The direction of the electron beam deflection by the deflecting means is preferably set to be perpendicular to the direction of electron beam deflection caused by a change of the magnetic field to be measured.

By adjusting the focusing position and magnification of the beam deflection with the means for enlarging the displacement, a waveform or pattern corresponding thereto may be projected onto a two-dimensional sensor/display as a time change at the position at which the electron beam has passed through the magnetic field to be measured. At this time, the time resolution depends on the intra-surface resolution on a two-dimensional sensor. It should be noted that although an electron beam is used in all of the following embodiments, any other charged particle beam that is sensitive to magnetic and electric fields may be used. It is also possible to make a multi-dimensional detection and display.

In an exemplary mode for carrying out the invention, means for controlling irradiation and non-irradiation of the electron beam may be disposed somewhere between the above source of the electron beam and the means for enlarging the displacement of the beam deflection. The timing of a signal for controlling the irradiation is synchronized with a periodic signal for changing the magnetic field to be measured or a frequency divisive thereof, whereby the waveform projected onto the sensor can be made easier to see.

First Exemplary Embodiment

An instrument constructed according to this embodiment is illustrated in FIG. 1. A source 101 of an electron beam and an electrode 102 are disposed within a vacuum chamber to generate an electron beam 10. To align this electron beam 10 at a desired aperture angle, the electron beam is passed through an aperture of an aperture plate 25 after passing through an electromagnetic lens 111. The electron beam 10 is further passed through a deflection electrode 24 and through the aperture of another aperture plate 26. The electron beam 10 then passes through a lens 112, a scanning and deflection coil 27, another lens 113, and further through a magnetic field 12 to be measured at a desired position and at a desired beam diameter.

In this embodiment, a magnetic head 28 is preferably used as the means for generating the magnetic field to be measured. A signal provided from an electric circuit 21 to generate the magnetic field is fed to the magnetic head 28, allowing the magnetic field 12 to change periodically. If an electric field is the characteristic to be measured, a signal generator which causes an electric field to change with time may be used instead of the electric circuit 21 to generate magnetic field.

Although an electron beam is used in the instrument of this embodiment, it may be substituted by another charged particle beam such as an ion beam having sensitivity to magnetic and electric fields. Although a magnetic field will be referred to below as the preferred object to be measured, it may be replaced with another object, such as an electric field insofar as it causes a deflection of the charged particle beam.

Figure 2:
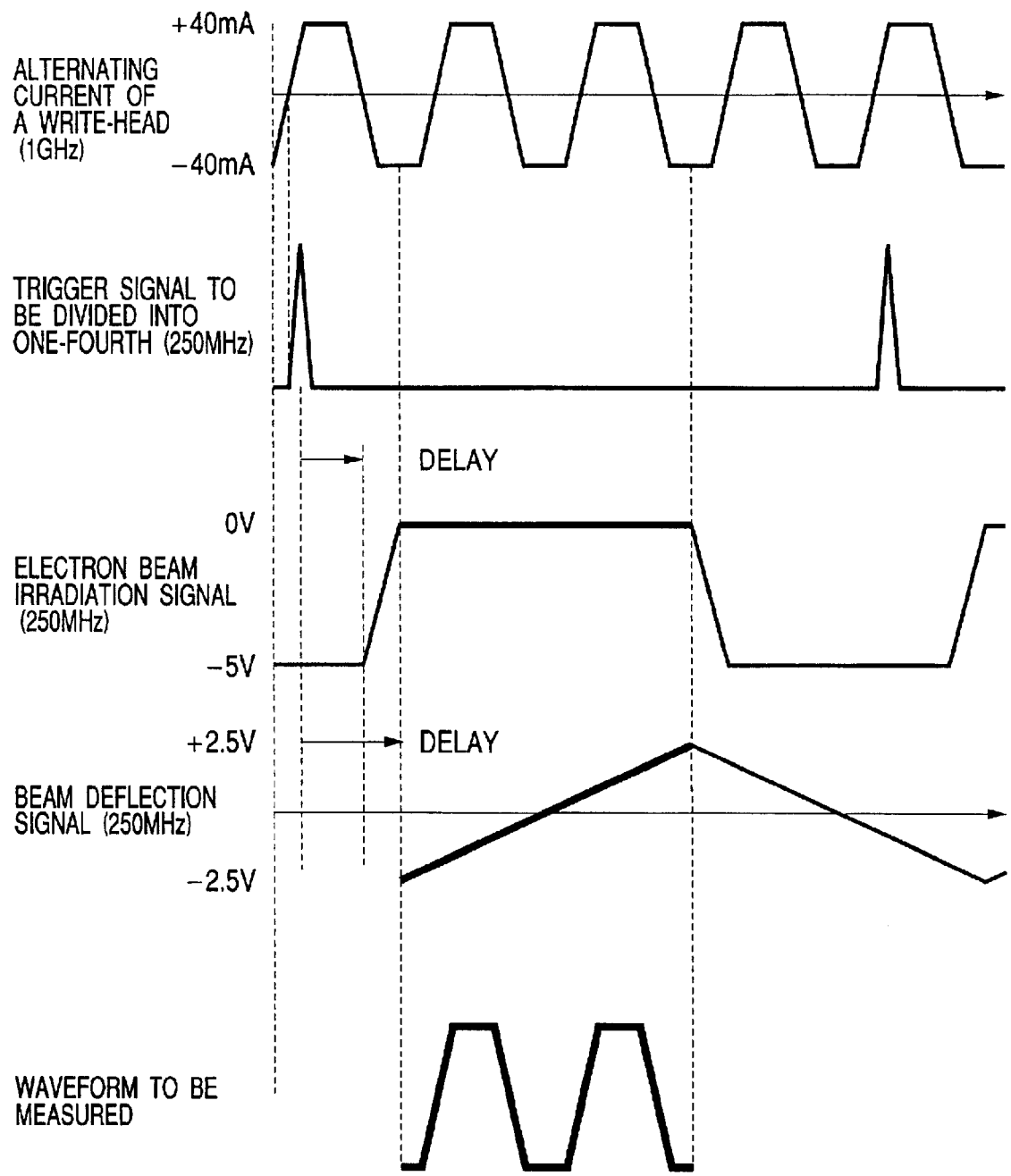
FIG. 2 is a diagram exemplifying signal waveforms used in the present invention.

The electron beam 10 which has passed through the magnetic field 12 to be measured further passes through a deflection electrode 13. A signal having a frequency of not higher than the frequency input to the magnetic head 28 is preferably fed to the deflection electrode 13. FIG. 2 shows examples of input signals. An alternating current of the head generated from the electric circuit 21 is here assumed to be 1 GHz. The alternating current of the head is divided to, for example, one-fourth by means of a divider 211 to generate a trigger signal of 250 MHz. A dividing ratio DR is arbitrary and can be expressed as follows:

$$DR = 1/n \text{ (n is a natural number)} \quad \text{(Equation 1)}$$

The trigger signal is split and is input to delay circuits 221 and 231, respectively. After a delay time is determined, these input signals are then fed respectively to a signal generator 22 for beam deflection and a signal generator 23 for beam scanning.

The signal generator 23 is a deflection signal generator for the supply of a signal to the deflection electrode 13, but for distinction from the signal generator 22 for beam deflection which supplies a signal to the deflection electrode 24, the signal generator 23 is designated herein as a signal generator for beam scanning in this embodiment. Although in this embodiment a single divider is illustrated, two separate dividers may be used for the signal generators 22 and 23, respectively. Further, although in this embodiment the delay circuits which receive the trigger signals are arranged in parallel with each other, a configuration may be used in which the delay circuits are arranged in series and signals extracted from the first and second circuits are input to the signal generators 22 and 23.

The signal generator 22 for beam deflection provides, for example, an electron beam irradiation signal of a rectangular waveform shown in FIG. 2 to the deflection electrode 24. With a ØV signal, the electron beam passes through the aperture of the aperture plate 26, while in other cases the electron beam does not pass through the aperture. In this embodiment, at every four periods (because of the 4:1 divider 211) of the alternating current of the head, the electron beam corresponding to about two periods of the alternating current passes through the aperture of the aperture plate 26. On the other hand, the signal generator 23 for beam scanning provides a beam deflection signal shown in FIG. 2 to the deflection electrode 13. In this embodiment, a triangular wave with a period four times that of the alternating current of the head is used as the beam deflection signal.

Figure 3:
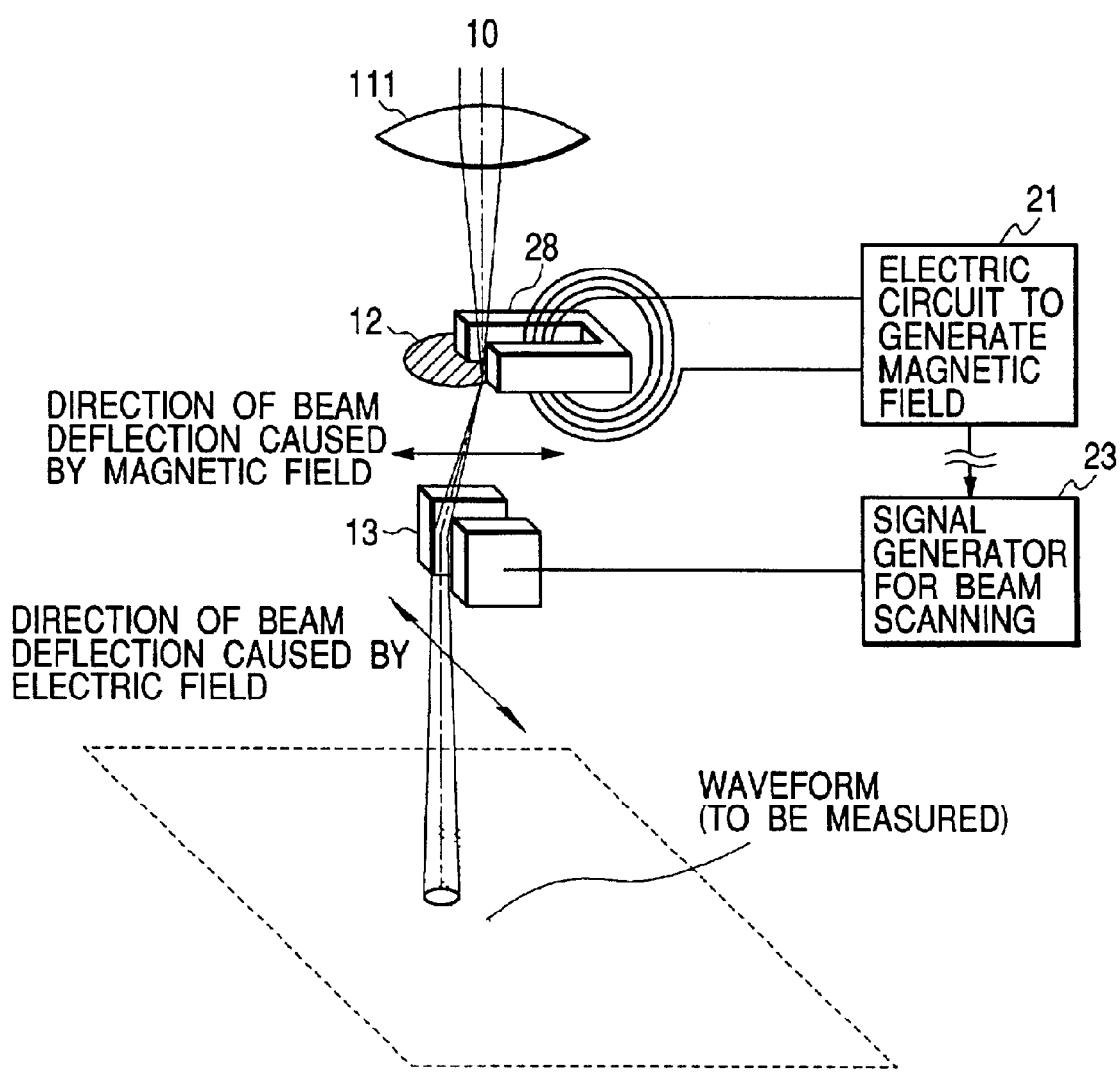
FIG. 3 illustrates a measurement principle according to the present invention.

At this time, the waveform of the magnetic field in the head is projected on the principle as schematically shown in FIG. 3. The electron beam 10 receives Lorentz's force from the magnetic field 12 of the magnetic head 28 and is deflected, whereby its track is bent. Further, with the deflection electrode 13 disposed below the magnetic field to be measured, the electron beam 10 is deflected in a direction perpendicular to the direction of beam deflection caused by magnetic field 12. That is, an axis in the direction of beam deflection caused by the magnetic field 12 and a time base are formed crosswise on the sensor, and the projected waveform indicates a time change of the measured magnetic field.

Figure 4:
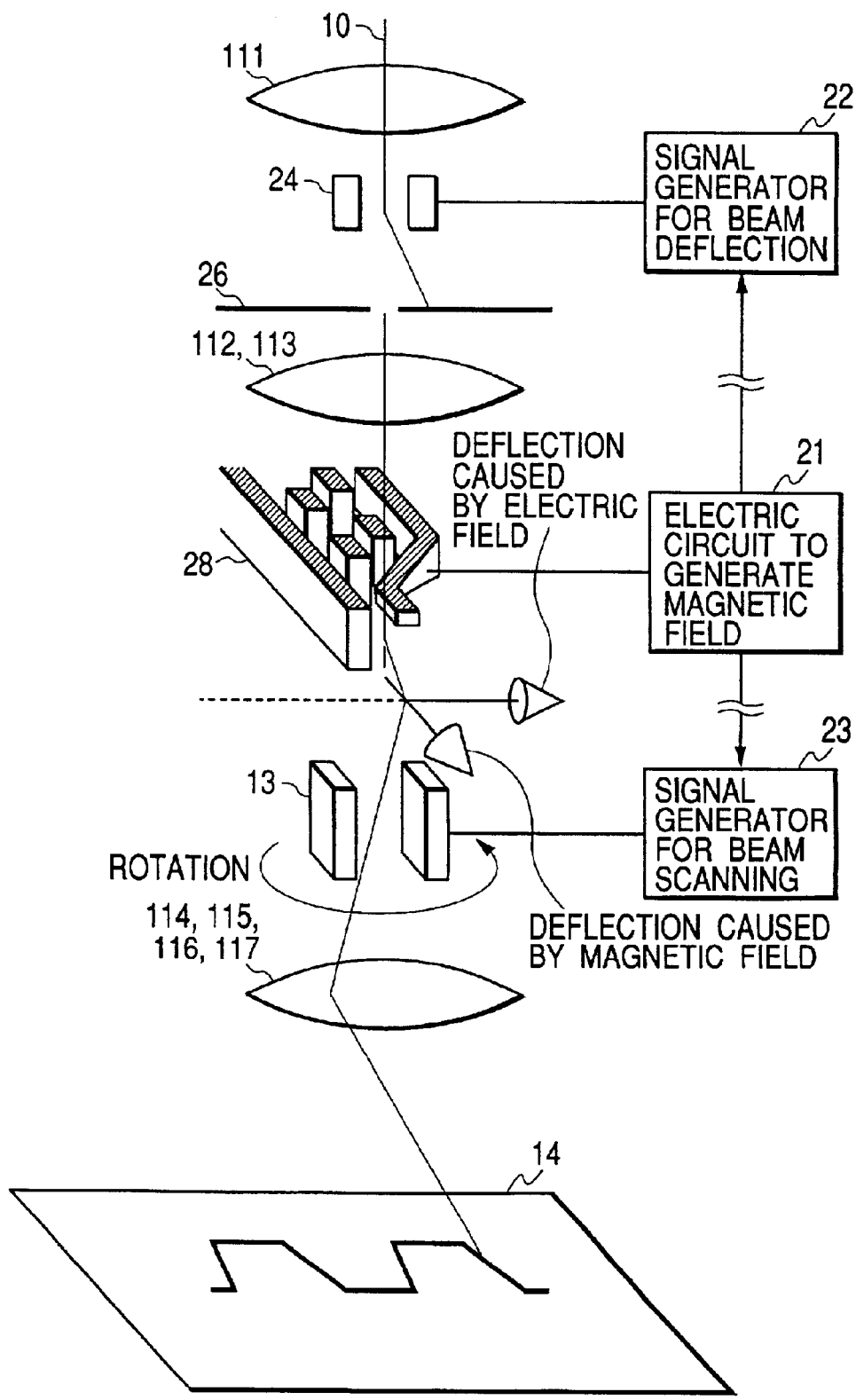
FIG. 4 illustrates directions of deflection of an electron beam in the present invention.

The electron beam 10 which has been passed through the desired position in the magnetic field 12 to be measured in FIG. 1 has its focusing surface adjusted and is enlarged to a desired magnification by lenses 114, 115, 116, and 117 and is then detected by an image sensor 14. The image sensor 14 is a two-dimensional image sensor such as, for example, a film, CCD camera, or image pickup tube. The sensor is schematically shown in FIG. 4. The deflection electrode 13 preferably can rotate in such a manner that its deflecting direction becomes orthogonal to the direction of beam deflection caused by the magnetic field to be measured. This rotation provides flexibility in selecting an appropriate output form.

Figure 5:
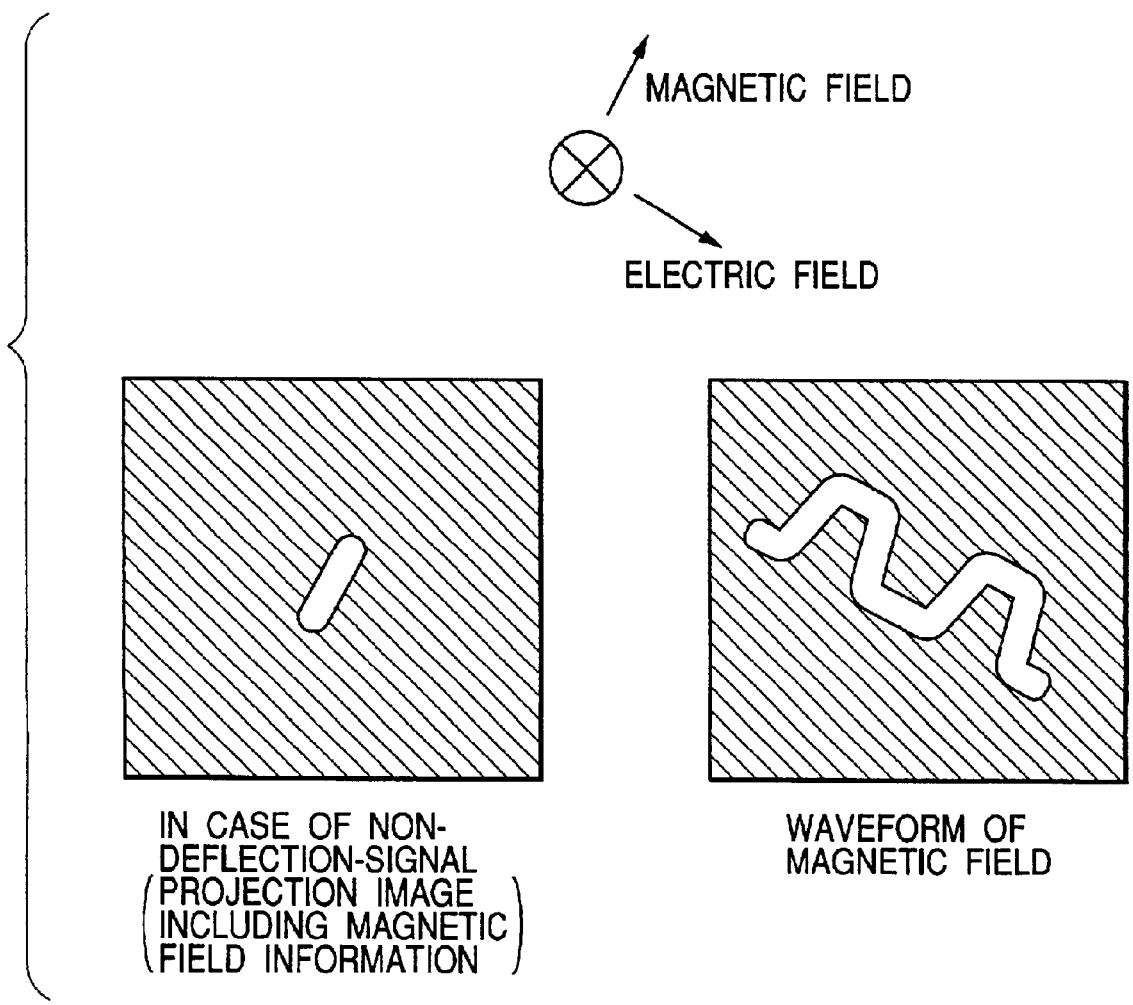
FIG. 5 illustrates exemplary waveforms obtained in the present invention.

In this embodiment, the deflection electrode 13 is a parallel plate electrode made up of two electrodes. However, a multi-electrode lens may also be used, such as an 8- or 12-electrode electrostatic lens. For example, if a plane of a dotted-line position indicated between the magnetic head 28 and the deflection electrode 13 in FIG. 4 is focused on the image sensor 14, there can be obtained a two-period waveform as shown on the right-hand side of FIG. 5. At this time, there is recognized such a direction of beam deflection caused by magnetic field as shown on the left-hand side of FIG. 5, which direction proves to be perpendicular to the direction of beam deflection caused by electric field in the deflection electrode 13. The position of the plane focused on the image sensor 14 is not specifically limited; it need only be oriented in a direction other than the center of deflection of the electron beam 10 caused by the magnetic field 12 to be measured and other than the deflection center of the deflection electrode 13. The said position is adjusted together with magnification while checking the balance of waveform on the image sensor 14. The resulting track of the electron beam is obtained as waveform. By adding a time base and an axis of magnetic field thereto it is possible to analyze the results of measurement of a dynamic magnetic field that changes rapidly.

Although the measurement of a field where a space is present such as a magnetic or electric field has been described above, this method is also applicable to the dynamic analysis of transformation such as a change with time of the state of magnetization in material or of a capacitor.

The angle between the direction of deflection of the charged particle beam caused by the magnetic field to be measured and the direction of deflection of the charged particle beam caused by the deflecting means other than the magnetic field to be measured is preferably set at 90°. The magnetic field to be measured and the deflecting means are disposed so that the charged particle beam passes through the magnetic field to be measured and the deflecting means in this order. Moreover, the frequency of the deflection signal fed to the means for deflecting the charged particle beam in a direction different (other than) from the direction of deflection of the charged particle beam caused by magnetic field is set at a value of not higher than the frequency of the magnetic field to be measured. Further, a triangular or sawtooth waveform is preferably used as the waveform of the deflection signal fed to the said charged particle beam deflecting means. Further, a direction different from the direction of deflection of the charged particle beam caused by magnetic field is set arbitrarily as a direction of deflection of the charged particle beam caused by the charged particle beam deflecting means.

In at least one embodiment of the present invention, there is preferably provided an instrument for measuring a magnetic field comprising: a source of a charged particle beam; means for converging the charged particle beam; a wire in which an electric current to be measured flows; means for making the charged particle beam pass through a desired position near the wire; means for deflecting the charged particle beam in a direction different (other than) from a direction of deflection of the charged particle beam caused by a magnetic field formed by the electric current to be measured; means for providing a signal to the means for deflecting the charged particle beam in the different direction to control the deflection of the charged particle beam; means for enlarging the displacement of the deflection of the deflected charged particle beam; a two-dimensional sensor for detecting the enlarged displacement of beam deflection; and a display for displaying a track of the charged particle beam detected by the sensor. Subsets of these features may also be used.

Further, there is preferably provided an instrument for measuring a magnetic field comprising: a source of a charged particle beam; means for converging the charged particle beam; means for generating an electric field to be measured; means for directing the charged particle beam to pass through a desired position in the electric field to be measured; means for deflecting the charged particle beam in a direction different from a direction of deflection of the charged particle beam caused by the electric field; means for providing a signal to the means for deflecting the charged particle beam in the different direction to control the deflection of the charged particle beam; means for enlarging the displacement of deflection of the deflected charged particle beam; a two-dimensional sensor for detecting the enlarged displacement of beam deflection; and a display for displaying a track of the charged particle beam detected by the sensor.

The invention also provides various methods for using the above instruments. For example, a method for measuring a magnetic field utilizing an interaction with a charged particle beam preferably comprises the steps of: generating a charged particle beam from a source of the charged particle beam; converging the charged particle beam; generating a magnetic field to be measured with use of a signal; directing the converged charged particle beam to pass through a predetermined position in the magnetic field; switching (turning on and off) the irradiation of the charged particle beam into the magnetic field at a position between the source of the charged particle beam and the means for generating the magnetic field to be measured; providing a signal to the means for turning on and off the irradiation into the magnetic field to control the irradiation and non-irradiation of the charged particle beam into the magnetic field; deflecting the charged particle beam in a direction different from a direction of deflection of the charged particle beam caused by the magnetic field with use of a signal while controlling the deflection with the fed signal; causing the magnetic field to be measured and the signal for deflecting the charged particle beam to change with a predetermined certain period; enlarging the displacement of deflection of the deflected charged particle beam and detecting the enlarged displacement of deflection with use of a two-dimensional sensor; and displaying a detected track of the charged particle beam. Subsets of the steps of this method may also be used.

The method may further comprise a step in which the angle between the direction of deflection of the charged particle beam caused by the magnetic field to be measured and the direction of deflection of the charged particle beam caused by the deflecting means different from the magnetic field to be measured is set at 90°. The method may further comprise a step in which the frequency of the deflecting signal fed to the means for deflecting the charged particle beam in a direction different from the direction of deflection of the charged particle beam caused by magnetic field is set at a value of not higher than the frequency of the magnetic field to be measured. The method may further comprise a step in which a triangular or sawtooth wave is used as the waveform of the deflecting signal fed to the means for deflecting the charged particle beam in a direction different from the direction of deflection of the charged particle beam caused by magnetic field.

There is further provided a method for measuring a current waveform, comprising the steps of: generating and converging a charged particle beam; allowing a current to be measured to flow through a wire; directing the charged particle beam to pass through a desired position near the wire; deflecting the charged particle beam in a direction different from a direction of deflection of the charged particle beam caused by a magnetic field formed by the current to be measured; providing a signal to the means for deflecting the charged particle beam in the different direction to control the deflection of the charged particle beam; causing the current to be measured and the signal for deflecting the charged particle beam to change with a predetermined certain period and enlarging the displacement of the deflected charged particle beam; and detecting the enlarged displacement of beam deflection with use of a two-dimensional sensor and displaying a detected track of the charged particle beam.

The invention further provides a similar method for measuring an electric field.

Second Exemplary Embodiment

In this second exemplary embodiment, reference will be made below to the measurement of a magnetic field which is realized without using the electron beam irradiation signal used in the first exemplary embodiment. An instrument construction according to this second embodiment is illustrated as a sectional view in FIG. 6. As in the first embodiment, a source 101 of electron beam and an electrode 102 are disposed within a vacuum chamber to generate electron beam 10. The electron beam 10 passes through lenses 111, 112, 113, and then passes through a scanning and deflection coil 27 and a desired position in a magnetic field 12 to be measured at a desired beam diameter. Also in this second embodiment, as in the first exemplary embodiment, a magnetic head 28 is used as the means for generating the magnetic field to be measured. A signal provided from an electric circuit 21 to generate the magnetic field is fed to the magnetic head 28, allowing the magnetic field 12 to vary periodically. If the object to be measured is an electric field, a signal generator for changing an electric field with time may be used instead of the electric circuit 21.

Although an electron beam is used in the instrument of this embodiment, any other charged particle beam, such as an ion beam, sensitive to magnetic and electric fields may be used. Although in the following description a magnetic field is used as the object to be measured, it may be substituted by another object such as an electric field insofar as it causes a deflection of the charged particle beam.

Figure 7:
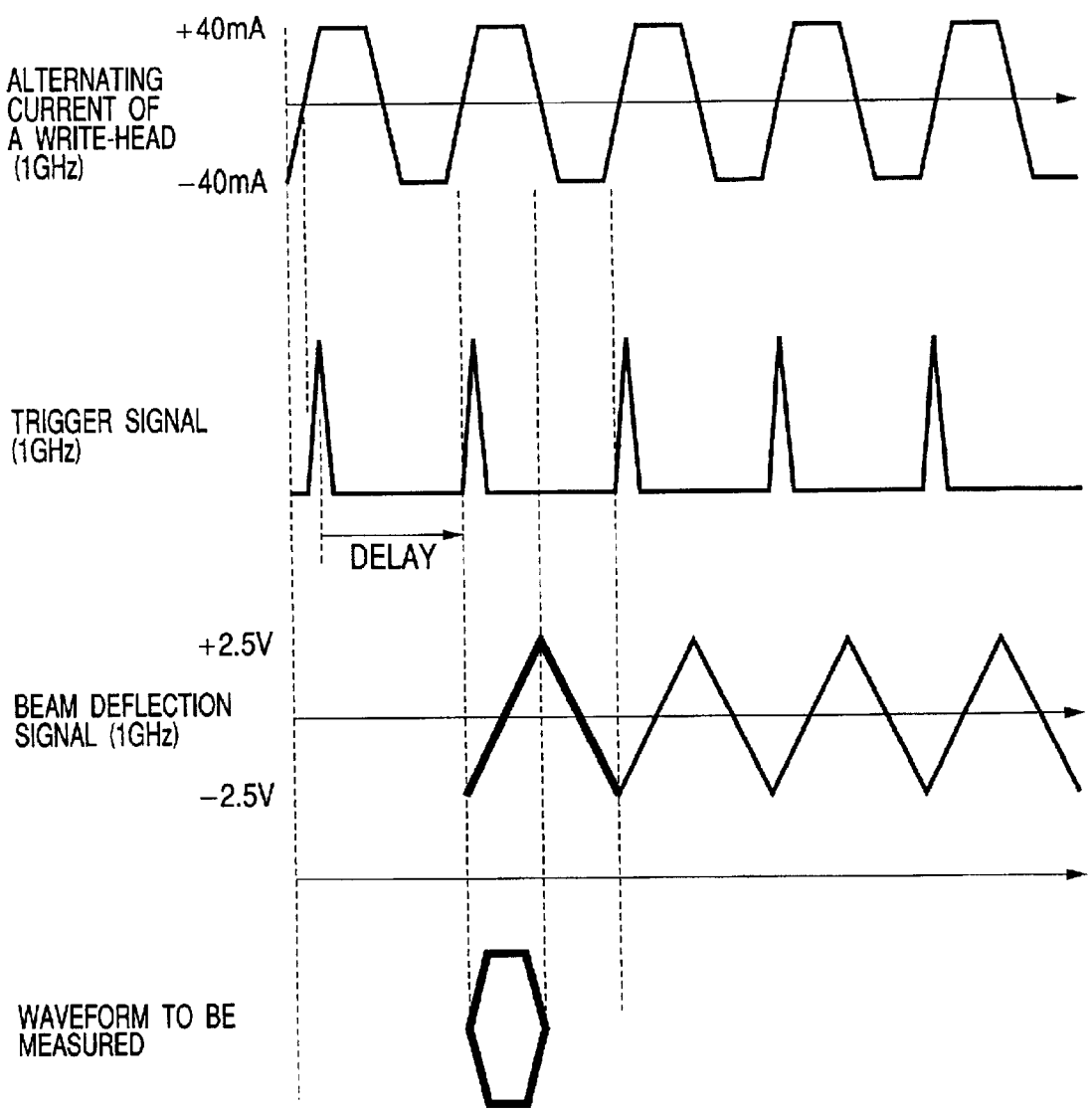
FIG. 7 is a diagram exemplifying signal waveforms used in the second instrument construction.

The electron beam 10 which has passed through the magnetic field 12 to be measured further passes through a deflection electrode 13. Examples of signals fed to the deflection electrode 13 are shown in FIG. 7. Assuming that an alternating current of the head generated from the electric circuit 21 is 1 GHz, a desired delay time is determined in a delay circuit 231 using a trigger signal of the same frequency as that of the alternating current of the head, and a beam deflection signal of, for example, a triangular waveform is generated in a signal generator 23 for beam scanning (a scanning signal generator). In this exemplary case, a dividing ratio in the divider is 1/1.

Figure 6:
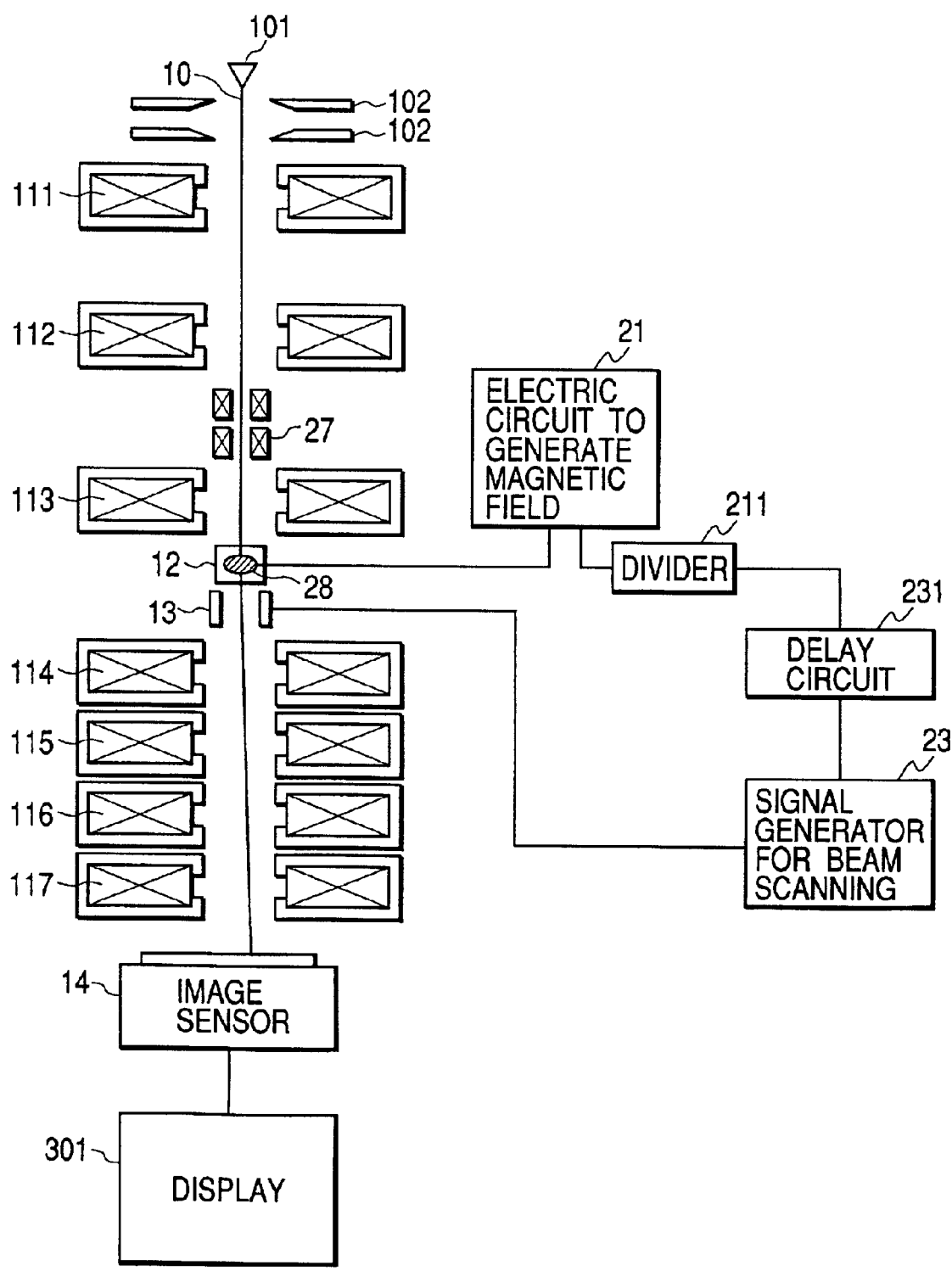
FIG. 6 illustrates a second exemplary instrument according to the present invention.
Figure 11:
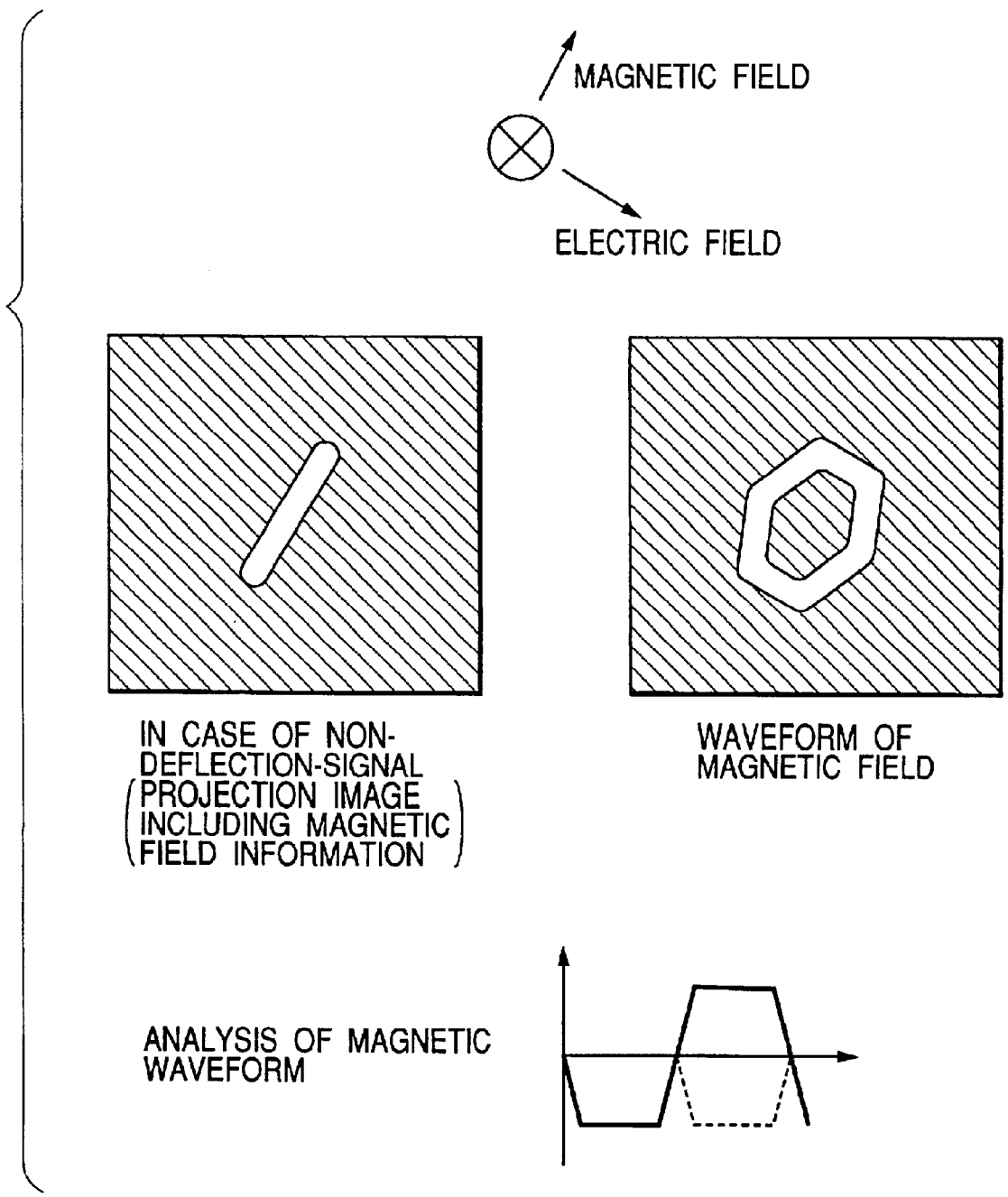
FIG. 11 illustrates another example of a waveform obtained in the present invention.

In FIG. 6, the electron beam which has been passed through the desired position in the magnetic field 12 to be measured has its focusing surface adjusted and is enlarged to a desired magnification by lenses 114, 115, 116, and 117, and the beam is then detected by an image sensor 14. As in the first embodiment, a two-dimensional image sensor such as, for example, a film, a CCD camera, or an image pickup tube, may be used as the image sensor 14. There is observed a pattern such as shown in FIG. 7, which is like a pattern drawn with one stroke while turning back halfway of one period of a waveform. Therefore, by adding a time base and an axis of magnetic field to this pattern it was possible to analyze the results of measurement of a dynamic magnetic field. FIG. 11 shows the waveform obtained.

Figure 8:
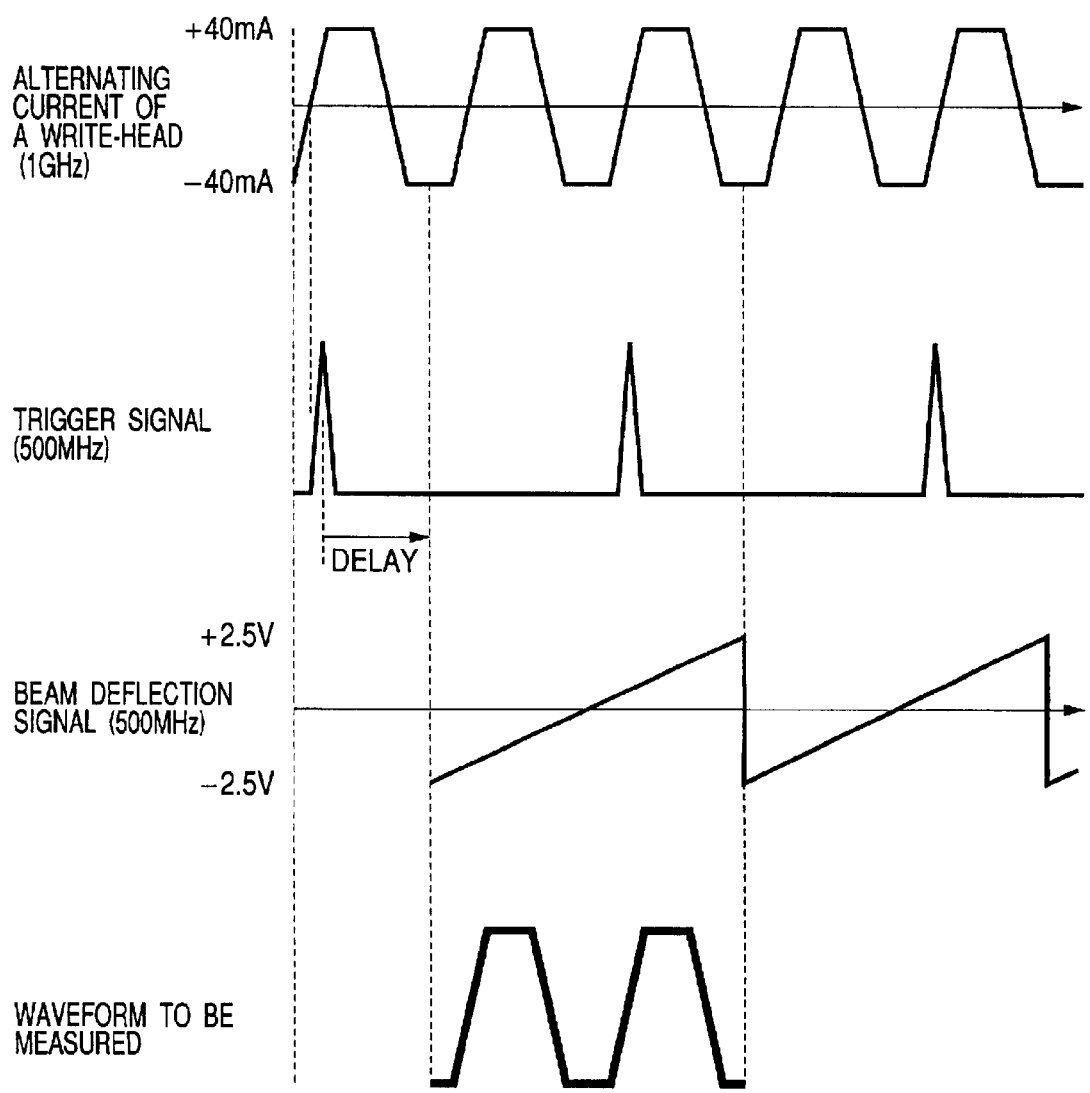
FIG. 8 is a diagram exemplifying signal waveforms used in the second instrument construction.

In this instrument construction it is possible to measure the waveform of magnetic field by input of another signal. FIG. 8 shows an example of a signal input to the deflection electrode 13. The alternating current of the magnetic head generated from the electric circuit 21 to generate magnetic field is set at 1 GHz and a half-divided (2:1) trigger signal is obtained by the divider 211. Further, after timing adjustment in the delay circuit 231, a beam deflection signal of a sawtooth wave as shown in FIG. 8 is generated in the signal generator 23 for beam scanning. By using this signal waveform, it is possible to obtain a waveform to be measured such as that shown in FIG. 8. By adding a time base and an axis of magnetic field thereto, it is possible to analyze the results of measurement of a dynamic magnetic field.

Third Exemplary Embodiment (Measuring Electric Current)

Using the various instruments of the present invention described above, a current waveform monitor, which will be described, may be implemented. Instrument construction and operation are similar as in FIG. 1 or FIG. 6, provided a current-flowing wire is laid at the installed position of the object to be measured. In this embodiment, a magnetizing current of the magnetic head is monitored.

Figure 9:
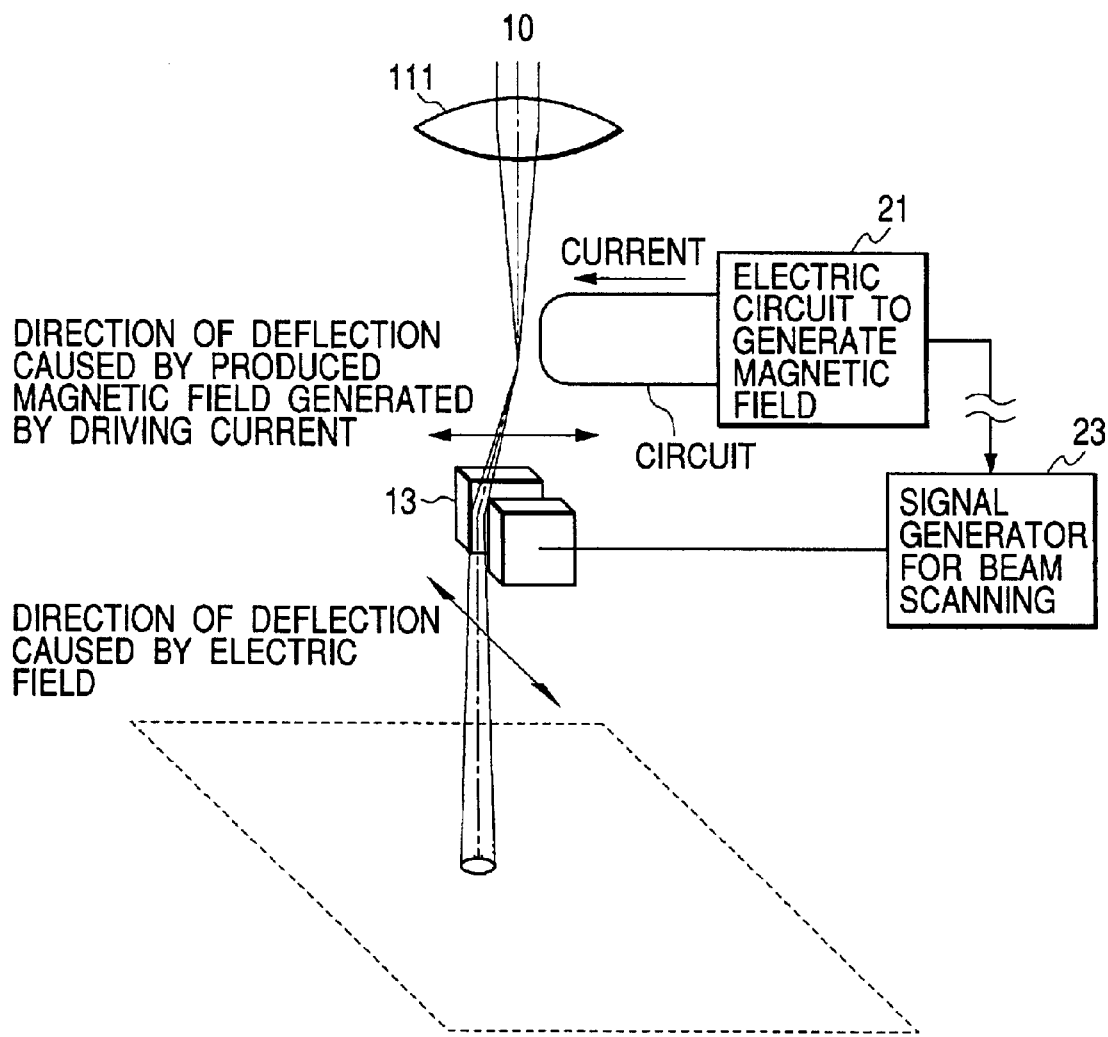
FIG. 9 illustrates a principle of current waveform measurement according to the present invention.
Figure 10:
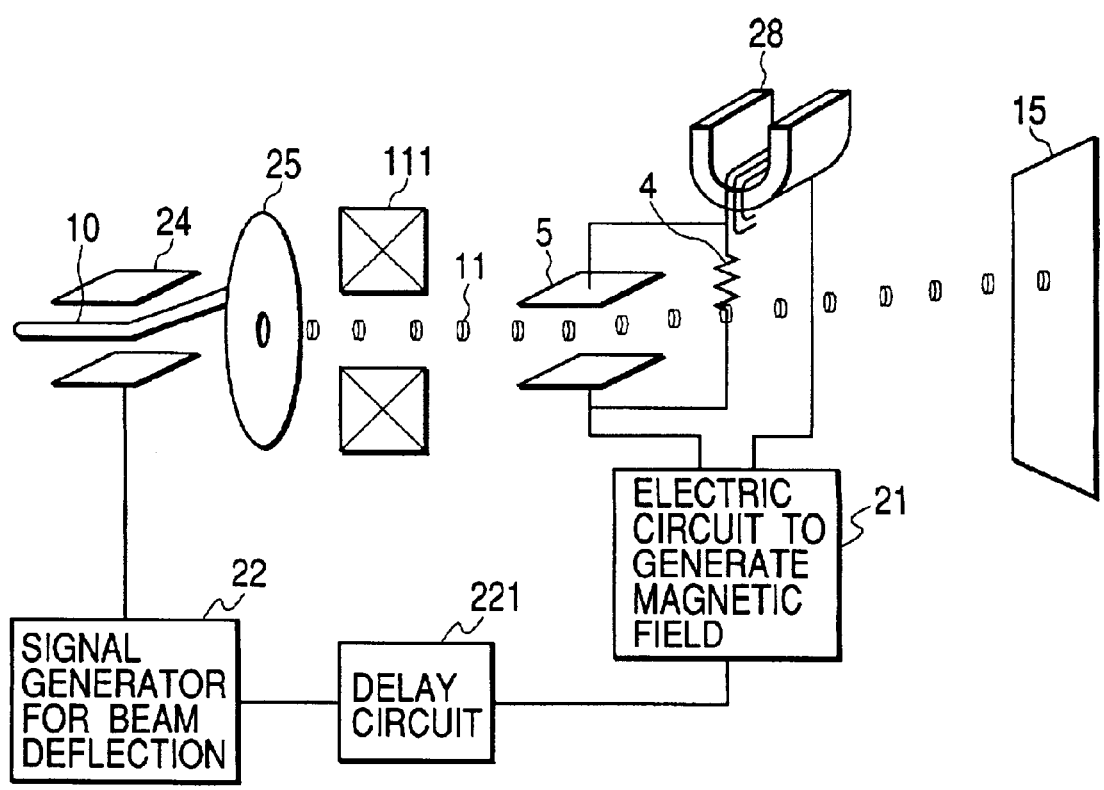
FIG. 10 illustrates a conventional technique for the measurement of a current waveform.

FIG. 9 shows schematically the principle upon which the waveform of a timewise varying magnetizing current is projected. The electric current provided from the electric circuit 21 to generate a magnetic field flows through the wire, and the electron beam 10 passes near the wire. A magnetic field is generated around the wire proportional to the amount of the electric current and the distance from the wire. With this magnetic field, the electron beam undergoes Lorentz's force and is deflected, whereby its track is bent. Further, the electron beam 10 is preferably deflected in a direction perpendicular to the direction of beam deflection caused by magnetic field by means of the deflection electrode 13 installed below the magnetic field to be measured. That is, an axis in the direction of beam deflection caused by the magnetic field which is created by the wire and a time base are formed crosswise on the sensor, and the track of electron beam projected represents a time change of magnetizing current as waveform or pattern.

As in the first and second embodiments, the deflected electron beam may be adjusted for focus and is enlarged to a desired magnification. The beam is then detected by the image sensor 14. The resulting waveform or pattern differs depending on the input signal and the instrument construction shown in FIG. 1 or FIG. 6, but, as is the case with the measurement of magnetic field, a change with time of electric current could be monitored from the track of electron beam projected on the sensor. In the case of a magnetizing current in the magnetic head, the current flowing in the wire is several tens of mA, while a probe current of the electron beam is on the order of a $\mu$A and is therefore very small. Thus, the influence of the passage of the electron beam near the wire on the waveform of magnetizing current may be almost negligible, and hence, it is possible to monitor the waveform of magnetizing current accurately.

According to the present invention, as set forth above, it is possible to measure and analyze magnetic and electric characteristics of a timewise changing device such as the measurement of a magnetic field or a magnetizing current in a magnetic recording head which is in operation.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. An instrument for measuring a magnetic field, comprising:

a source of a charged particle beam;

means for generating a magnetic field to be measured;

means for directing the charged particle beam through a desired position in the magnetic field to be measured, thereby deflecting the beam in a first direction;

means for deflecting the charged particle beam in a second direction, wherein said second direction is different from said first direction; and a two-dimensional sensor for detecting the displacement of beam deflection, wherein the magnetic field to be measured and the deflecting means are disposed such that the charged particle beam passes through the magnetic field to be measured before passing through the deflecting means.

2. An instrument for measuring a magnetic field according to claim 1, further comprising:
   means for converging the charged particle beam before directing the beam to said magnetic field to be measured;
   means for providing a deflecting signal to the means for deflecting the charged particle beam in the second direction to control the deflection of the charged particle beam;
   means for enlarging the displacement of deflection of the charged particle beam after the beam is deflected by the means for deflecting; and
   a display for displaying a track of the charged particle beam detected by the sensor.

3. An instrument for measuring a magnetic field according to claim 2, wherein the frequency of the deflecting signal fed to the means for deflecting the charged particle beam is set at a value of not higher than the frequency of the magnetic field to be measured.

4. An instrument for measuring a magnetic field according to claim 2, wherein a triangular or sawtooth waveform is used as the waveform of the deflecting signal fed to the means for deflecting the charged particle beam.

5. An instrument for measuring a magnetic field according to claim 2, wherein
   said means for generating a magnetic field to be measured comprise a wire in which an electric current to be measured flows, and
   said means for directing the charged particle beam through a desired position in the magnetic field to be measured directs the particle beam near the wire.

6. An instrument for measuring a magnetic field according to claim 1, further comprising:
   means for switching on and off the irradiation of the charged particle beam into the magnetic field to be measured at a position between the source of the charged particle beam and the means for generating the magnetic field to be measured; and
   means for providing a signal to the switching means to control the irradiation and non-irradiation of the charged particle beam into the magnetic field to be measured.

7. An instrument for measuring a magnetic field according to claim 6, wherein the magnetic field to be measured and the deflecting means are disposed such that the charged particle beam passes through the magnetic field to be measured before passing through the deflecting means.

8. An instrument for measuring a magnetic field according to claim 1, wherein the angle between the first direction and the second direction is approximately 90 degrees.

9. An instrument for measuring a magnetic field according to claim 1, wherein the second direction of deflection of the charged particle beam deflected by the means for deflecting the charged particle beam is rotatingly adjustable with respect to the first direction.

10. An instrument for measuring a magnetic field according to claim 1, wherein
    said means for generating a magnetic field to be measured comprise a wire in which an electric current to be measured flows, and
    said means for directing the charged particle beam through a desired position in the magnetic field to be measured directs the particle beam near the wire.

11. An instrument for measuring a field, comprising:
    a source of a charged particle beam;
    means for generating an electric field to be measured;
    means for directing the charged particle beam through a desired position in the electric field to be measured, thereby deflecting the beam in a first direction;
    means for deflecting the charged particle beam in a second direction, wherein said second direction is different from said first direction; and
    a two-dimensional sensor for detecting the displacement of beam deflection, wherein the electric field to be measured and the deflecting means are disposed such that the charged particular beam passes through the electrical field to be measured before passing through the deflecting means.

12. An instrument for measuring a field according to claim 11, further comprising:
    means for converging the charged particle beam before directing the beam to said electric field to be measured;
    means for providing a deflecting signal to the means for deflecting the charged particle beam in the second direction to control the deflection of the charged particle beam;
    means for enlarging the displacement of deflection of the charged particle beam after the beam is deflected by the means for deflecting; and
    a display for displaying a track of the charged particle beam detected by the sensor.

13. A method for measuring a magnetic field utilizing an interaction with a charged particle beam, comprising the steps of:
    generating a charged particle beam from a source of the charged particle beam;
    converging the charged particle beam;
    generating a magnetic field to be measured using a first signal that varies with a predetermined period;
    directing the converged charged particle beam to pass through a predetermined position in the magnetic field to be measured, thereby causing the beam to be deflected in a first direction; and
    deflecting the charged particle beam in a second direction using a second control signal which is based on said first signal, wherein said second direction is different from said first direction.

14. A method for measuring a magnetic field according to claim 13, further comprising the steps of:
    enlarging the displacement of deflection of the deflected charged particle beam;
    detecting the enlarged displacement of deflection using a two-dimensional sensor; and
    displaying a detected track of the charged particle beam.

15. A method for measuring a magnetic field according to claim 14, further comprising the steps of:
    switching on and off the irradiation of the charged particle beam into the magnetic field to be measured at a position between the source of the charged particle beam and the means for generating the magnetic field to be measured; and
    providing a third signal to the switching means to control the irradiation and non-irradiation of the charged particle beam into the magnetic field, wherein said third signal is related to said first signal.

16. A method for measuring a magnetic field according to claim 14, wherein said step of generating a magnetic field includes directing an electric current through a wire, and said step of directing the charged particle beam to pass through the magnetic field to be measured includes directing the particle beam near said wire.

17. A method for measuring a magnetic field according to claim 13, wherein the angle between the first direction and the second direction is approximately 90 degrees.

18. A method for measuring a magnetic field according to claim 13, wherein the frequency of the first signal is at least as high as the frequency of the second control signal.

19. A method for measuring a field, comprising the steps of:

generating a charged particle beam from a source of the charged particle beam;

converging the charged particle beam;

generating an electric field to be measured using a first signal that varies with a predetermined period;

directing the converged charged particle beam to pass through a predetermined position in the electric field to be measured, thereby causing the beam to be deflected in a first direction; and deflecting the charged particle beam in a second direction using a second control signal which is based on said first signal, wherein said second direction is different from said first direction.

20. An instrument comprising:

a source of a beam;

a magnetic or electric field to be measured oriented to direct the beam from said source in a first direction;

a deflection electrode oriented to direct the beam in a second direction after the beam has passed through the magnetic or electric field; and a sensor to detect the beam after the beam has been directed by the deflection electrode.

* * * * *